(12) United States Patent (10) Patent No.: US 9,523,726 B2
Heumphreus et al. (45) Date of Patent: Dec. 20, 2016

(54) RF REFLECTOR

(71) Applicant: The Boeing Company, Chicago, IL (US)

(72) Inventors: Paul R. Heumphreus, St. Peters, MO (US); William J. Harper, Troy, IL (US); Jeffrey D. Martin, O'Fallon, MO (US); Edward H. Wooldridge, Farmington, MO (US); Martha J. Molander, St. Charles, MO (US)

(73) Assignee: The Boeing Company, Chicago, IL (US)

( * ) Notice: Subject to any disclaimer, the term of this patent is extended or adjusted under 35 U.S.C. 154(b) by 332 days.

(21) Appl. No.: 14/335,748

(22) Filed: Jul. 18, 2014

(65) Prior Publication Data

US 2016/0018451 A1 Jan. 21, 2016

(51) Int. Cl.
| | |
|---|---|
| *G01R 29/08* | (2006.01) |
| *H01Q 15/14* | (2006.01) |
| *H01Q 3/20* | (2006.01) |
| *G01R 31/00* | (2006.01) |
| *H01Q 17/00* | (2006.01) |
| *G01S 7/40* | (2006.01) |

(52) U.S. Cl.
CPC ....... *G01R 29/0835* (2013.01); *G01R 29/0814* (2013.01); *G01R 31/008* (2013.01); *H01Q 3/20* (2013.01); *H01Q 15/14* (2013.01); *H01Q 17/00* (2013.01)

(58) Field of Classification Search
CPC ............ G01R 29/0835; G01R 29/0814; G01R 31/008; H01Q 17/00; H01Q 15/14; H01Q 3/20

USPC ............................................. 342/173, 174, 5
See application file for complete search history.

(56) References Cited

U.S. PATENT DOCUMENTS

| | | | | | |
|---|---|---|---|---|---|
| 3,623,107 | A | * | 11/1971 | Holdren, III | H01Q 1/082 342/173 |
| 3,972,043 | A | * | 7/1976 | Locus | H01Q 15/23 342/11 |
| 5,170,167 | A | * | 12/1992 | Rix | H01Q 15/23 342/11 |

(Continued)

FOREIGN PATENT DOCUMENTS

CN 103308801 A 9/2013

OTHER PUBLICATIONS

Microwave Absorber: ECCOSORB®, retrieved from the Internet: http://www.eccosorb.com/products-eccosorb-high-loss-absorbers.htm; May 8, 2014, (3 pgs).

(Continued)

*Primary Examiner* — John B Sotomayor
(74) *Attorney, Agent, or Firm* — Toler Law Group, P.C.

(57) ABSTRACT

A radio frequency (RF) reflecting apparatus includes a curved reflecting element and resistive material coupled to the curved reflecting element proximate two or more edges of the curved reflecting element. The resistive material has a first portion with a first conductance and a second portion with a second conductance that differs from the first conductance. The RF reflecting apparatus also includes a frame coupled to the curved reflecting element and at least one wheel coupled to the frame. The at least one wheel is configured to enable to translation of the curved reflecting member.

20 Claims, 3 Drawing Sheets

(56) References Cited

U.S. PATENT DOCUMENTS

| | | | | |
|---|---|---|---|---|
| 5,488,372 | A | * | 1/1996 | Fischer .................... B64C 3/14 244/119 |
| 5,731,777 | A | | 3/1998 | Reynolds |
| 6,115,003 | A | * | 9/2000 | Kozakoff ............... H01Q 1/081 342/10 |
| 6,404,383 | B1 | * | 6/2002 | Knezek .................... G01S 7/41 342/165 |
| 6,977,624 | B1 | * | 12/2005 | Szente .................... H01Q 3/04 342/8 |
| 7,133,001 | B2 | * | 11/2006 | Mrstik ................... H01Q 1/082 342/10 |
| 7,948,425 | B2 | * | 5/2011 | Bernhardt ............. B64G 1/105 342/165 |
| 2012/0107553 | A1 | * | 5/2012 | Appleton ................ F03D 1/065 428/136 |
| 2015/0276926 | A1 | * | 10/2015 | Bowers ................ G01S 13/887 342/5 |
| 2016/0018451 | A1 | * | 1/2016 | Heumphreus .......... H01Q 17/00 324/628 |

OTHER PUBLICATIONS

RF Absorber Materials—Panashield, retrieved from the Internet: http://www.ets-lindgren.com/EMCAbsorbers; May 8, 2014, (4 pgs).

EMC Absorbers | ETS-Lindgren, retrieved from the Internet: http://www.panashield.com/emc_absorbers.asp; May 8, 2014, (3 pgs).

Rama Krishna et al., Assessment of HMDS Concave Triangular Serrated CATRs by Changing Number of Serrations; International Journal of ISSN 0974-2107 Systems and Technologies, Jun. 2010, vol. 3, No. 1, (8 pgs).

Microwave Absorbing Materials Solutions, retrieved from the Internet: http://www.www.lairdtech.com; 2011, Laird Technologies, Inc., (15 pgs).

Radio Wave Absorbers—for EMC anechoic chambers/for microwave anechoic chambers—IP-BL/IP/IP-BX/ID/ICM/IB/IS/IS-SM/IK/ICT series—Thin type—IR/ISF/ITB series, retrieved from the Internet: http://www.tdk.co.jp/rohs/; Sep. 2013, (19 pgs).

RF Reflectors & Scanners, retrieved from the Internet: http://www.composites.com/applications/body_dishes.htm, 2009 Beaufort Composite Technologies, Inc.

Compact Range Products, retrieved from the Internet: www.orbitfr.com, 2006, (3 pgs).

\* cited by examiner

RF REFLECTOR

GOVERNMENT INTEREST

This invention was made with Government support. The Government has certain rights to this invention.

THE DISCLOSURE

The present disclosure is generally related to a Radio Frequency (RF) reflector for use during testing of electronic systems on a product.

BACKGROUND

Devices that emit high power radio frequency (RF) signals can interfere with other nearby devices. For example, a signal emitted by a radar system or a high power radio transmitter onboard a platform can cause interference with other electronics onboard or nearby the platform. To determine whether interference from an RF signal source presents a problem, RF emissions interference testing may be performed. During an RF emissions interference test, the RF signal source is caused to transmit an RF signal, and other devices that will be used with or near the RF signal source are tested to determine whether the RF signal interferes with their operation.

For certain products, such as airborne and space-borne platforms, it can be difficult and/or expensive to simulate an actual operational environment during RF emissions interference testing. For example, if the product is on or near the ground, downward directed. RF signals may reflect from the ground and cause interference that would not be present if the product were in flight or in orbit. To test such products, energy emitted by the RF signal source may be absorbed or reflected from a test area to more accurately simulate how the RF signal source will interact with other electronic systems onboard the product. However, materials to absorb the energy at close proximity tend to be expensive and relatively immobile due to size and weight.

SUMMARY

In a particular embodiment, a radio frequency (RF) reflecting apparatus includes a curved reflecting element. The RF reflecting apparatus further includes resistive material coupled to the curved reflecting element proximate two or more edges of the curved reflecting element. The resistive material has a first portion with a first conductance and a second portion with a second conductance that differs from the first conductance. The RF reflecting apparatus also includes a frame coupled to the curved reflecting element and at least one wheel coupled to the frame. The at least one wheel is configured to enable translation of the curved reflecting member.

In another embodiment, a method includes translating a radio frequency (RF) reflecting apparatus from a first position to a second position relative to a product. The method also includes performing an RF emission interference test of a component of the product. The RF reflecting apparatus, at the second position, reflects a first signal portion of an RF signal away from the product. The RF reflecting apparatus includes a curved reflecting element and resistive material coupled to the curved reflecting element proximate two or more edges of the curved reflecting element. The resistive material has a first resistive portion with a first conductance and a second resistive portion with a second conductance that differs from the first conductance. The RF reflecting apparatus also includes a frame coupled to the curved reflecting element and at least one wheel coupled to the frame. The at least one wheel is configured to enable translation of the curved reflecting member.

DETAILED DESCRIPTION

In a particular embodiment, a movable radio frequency (RF) reflecting apparatus may be used to reflect energy away from a product (such as an aircraft, a spacecraft, or another platform) during RF emissions interference testing. The RF reflecting apparatus may be configured to be moved (e.g., translated and/or rotated) into position relative to the product. The RF reflecting apparatus may be relatively light weight (e.g., moveable under human power) and low cost. Further, since the RF reflecting apparatus can be moved to the product under test, costs of transporting the product to a testing environment, such as an anechoic chamber, can be saved.

In a particular embodiment, as described further below, the RF reflecting apparatus includes a curved reflecting element coupled to a frame. The frame is coupled to one or more wheels that enable translation and/or rotation of the RF reflecting apparatus. The curved reflecting element is configured to reflect RF energy away from the product. Since some portion of the RF energy may propagate along the RF reflecting apparatus (e.g., as a surface wave), the RF reflecting apparatus may be configured to inhibit emission of energy from edges of the curved reflecting element. For example, a resistive material may be coupled to edges of the curved reflective element. The resistive material may be configured to gradually transition from a first conductance (e.g., approximately matching a conductance of the curved reflective element) to a second conductance (e.g., approximately matching to a conductance of free space or air). To illustrate, a first portion of the resistive material closest to the edge of the curved reflecting element may have a first conductance, and a second portion of the resistive material furthest from the edge of the curved reflecting element may have a second conductance that is different from (e.g., less than) the first conductance. The RF reflecting element may also include an RF absorbing foam at one or more edges of the curved reflecting element. The RF absorbing foam may both mitigate RF energy reflections toward the product and reduce risk of damage to the product while moving the RF reflecting apparatus into position relative to the product.

Figure 1A:
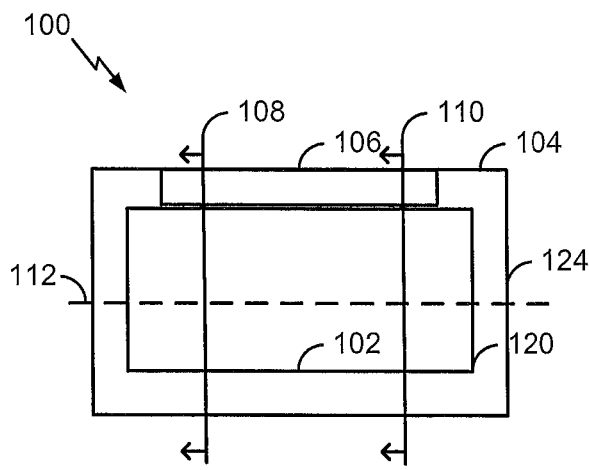
FIGS. 1A, 1B, 1C, 1D, and 1E are diagrams of various views of a radio frequency (RF) reflecting apparatus.
Figure 1D:
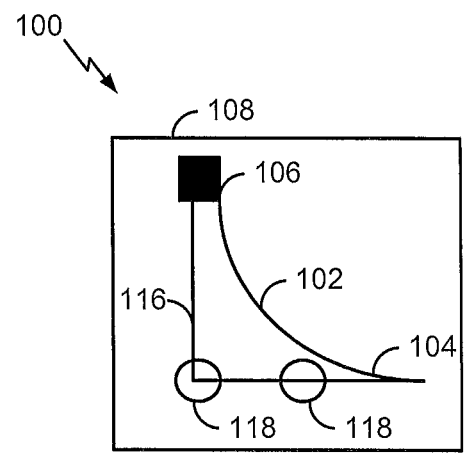
Figure 1B:
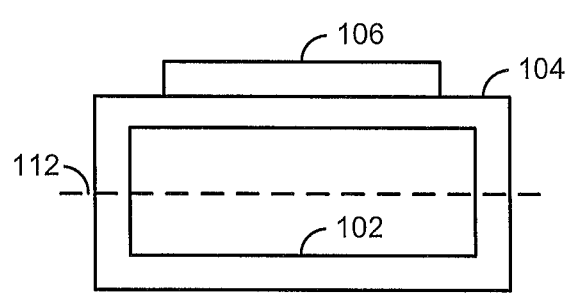
Figure 1E:
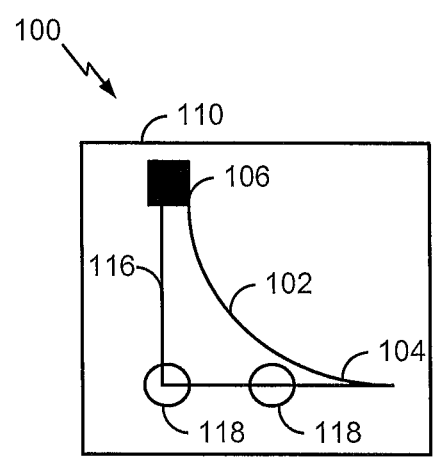
Figure 1C:
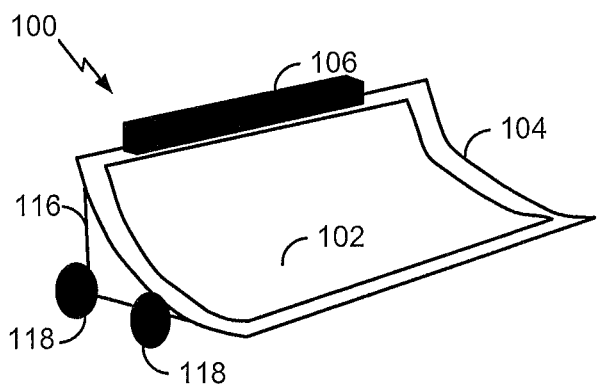

Referring to FIGS. 1A, 1B, 1C, 1D, and 1E, various views of a particular embodiment of an RF reflecting apparatus 100 are shown. FIG. 1A shows a top view of the RF reflecting apparatus 100. FIG. 1B shows a front view of the RF reflecting apparatus 100. FIG. 1C shows a perspective view of the RF reflecting apparatus 100. FIG. 1D shows a first cross-section view of the RF reflecting apparatus 100 along section line 108 of FIG. 1A, and FIG. 1E shows a second cross-section view of the RF reflecting apparatus 100 along section line 110 of FIG. 1A.

The RF reflecting apparatus 100 includes a curved reflecting element 102. The curved reflecting element 102 may be formed of an electrically conductive material, such as sheet metal. To illustrate, the curved reflective element 102 may be formed of stainless steel (or another steel alloy), aluminum, copper, or another metal. The curved reflecting element 102 is curved to reflect energy away from a product under test, as described further below. The curved reflecting element 102 may be coupled to and supported by a frame 116. In a particular embodiment, the frame 116 may be formed of a non-conductive material, such as one or more fiber glass elements.

A resistive material 104 is coupled to at least a portion of an edge 120 of the curved reflecting element 102. For example, in FIG. 1A-1C, the resistive material 104 is disposed along or attached to two or more edges 120 of the curved reflecting element 102. The resistive material 104 may be configured to transition from a first conductance (e.g., proximate the edge 120 of the curved reflective element 102) to a second conductance (e.g., proximate an edge 124 of the RF reflecting apparatus 100). The transition from the first conductance to the second conductance may be gradual or step-wise. In a particular embodiment, the first conductance approximately matches a conductance of the curved reflective element 102, and the second conductance approximately matches a conductance of free space or air. In this context, a particular conductance approximately matches another particular conductance when the particular conductances are sufficiently close in value that RF energy above a design threshold is not emitted at an interface between the particular conductances. Thus, the resistive material 104 reduces sharp conductance transitions that may lead to free-space emission of energy propagating along a surface of the curved reflecting element 102. In a particular embodiment, the resistive material 104 includes a resistive taper tape coupled to the curved reflective element 102 or to the frame 116 supporting the curved reflective element 102. Alternatively or in addition, the resistive material 104 may include a resistive card (also referred to as an "R-card") coupled to the curved reflective element 102 or to the frame 116.

An RF absorbing foam 106 may be coupled to at least an edge of the RF reflecting apparatus 100 that will be position nearest the product during RF emissions interference testing of the product. For example, in the embodiment illustrated in FIGS. 1A-1E, the RF reflecting apparatus 100 is configured to be position under the product. Accordingly, the RF absorbing foam 106 is coupled at least to a top edge of the RF reflecting apparatus 100 (e.g., to the resistive material 104 or the frame 116). The RF absorbing foam 106 provides further mitigation of RF energy that may otherwise propagate toward the product. For example, resistive material 104 may inhibit propagation of energy from the curved reflective element 102 toward the product (e.g., at the upper edge of the RF reflecting apparatus 100 in FIGS. 1A-1E), and the RF absorbing foam 106 may absorb at least a portion of any energy that is not dissipated by the resistive material 104.

In a particular embodiment, the frame 116 or another portion of the RF reflecting apparatus 100 may be coupled to one or more wheels, such as a wheel assembly 118. The wheel assembly 118 enables movement (e.g., translation and/or rotation) of the RF reflecting apparatus 100 into a desired position. For example, the RF reflecting apparatus 100 may be rolled to a position under a product to conduct RF emissions interference testing and may be subsequently rolled away from the product after the RF emissions interference testing is complete. Although the embodiment illustrated in FIGS. 1A-1E includes four wheels, in other embodiments, the wheel assembly 118 may include more than four wheels or fewer than four wheels.

In a particular embodiment, the curved reflecting element 102 may be elongated along an axis 112 and may have a substantially uniform cross-section at each location that is perpendicular to the axis 112. For example, a first cross-section 108 of the curved reflecting element 102 (illustrated in FIG. 1D) may have the same size and shape as a second cross-section 110 of the curved reflecting element 102 (as illustrated in FIG. 1E). The first cross-section 108 may be taken perpendicular to the axis 112 at a first location (e.g., along section line 108 of FIG. 1A), and the second cross-section 110 may be taken perpendicular to the axis 112 at a second location (e.g., along section line 110 of FIG. 1A). In a particular embodiment, the curved reflecting element 102 is formed by forming a single bend between two edges of a sheet of metal. This is in contrast to reflectors used, for example, in anechoic chambers, which are generally curved in multiple planes (e.g., spherically curved). The simplified shape of the curved reflective element 102 reduces manufacturing cost of the curved reflective element 102 relative to reflectors having more complex curvatures (e.g., multi-axis or multi-plane curves).

During operation, the RF reflecting apparatus 100 may be moved (e.g., translated, rotated, or both) into position relative to a product under test. The wheel assembly 118 facilitates moving the RF reflecting apparatus 100 into position under manual power, and the RF absorbing foam 106 may prevent damage as a result of accidental contact between the RF reflecting apparatus 100 and the product during movement of the RF reflecting apparatus 100.

When the RF reflecting apparatus 100 is in position, an RF emissions interference test may be initiated. The curved reflecting element 102 is configured to reflect RF energy emitted by a first device (such as a radar array) of the product away from the product. Thus, the RF energy emitted by the first device is not reflected back to the product (e.g., from the ground) in a manner that causes interference with other devices of the product. This enables simulation of use of the first device in a manner that mimics normal operation of the product (e.g., in an environment far from the ground where ground reflections are relatively low power RF signals). While a first portion of the RF energy is reflected into free space away from the product by the curved reflecting element 102, a second portion of the RF energy may propagate along a surface of the curved reflecting element 102. The resistive material 104 may dissipate some of (or all of) the second portion of the RF energy. For example, a third portion of the RF energy may be reflected by, emitted by, or absorbed by a portion of the resistive material 104 that is closest to the curved reflective element 102 (e.g., closest to the edge 120). Another portion (e.g., a fourth portion) of the RF energy may be dissipate by the resistive material 104 (e.g., converted to heat). Finally, the RF absorbing foam 106 may absorb yet another portion (e.g., a fifth portion) of the RF energy that is reflected toward the product or emitted by an upper edge of the curved reflecting element 102.

Accordingly, the RF reflecting apparatus 100 provides a low-cost and easy to use solution to testing certain RF emitting devices, such as ground facing radar systems, without requiring positioning an entire product that contains the RF emitting device in an anechoic chamber.

Figure 2:
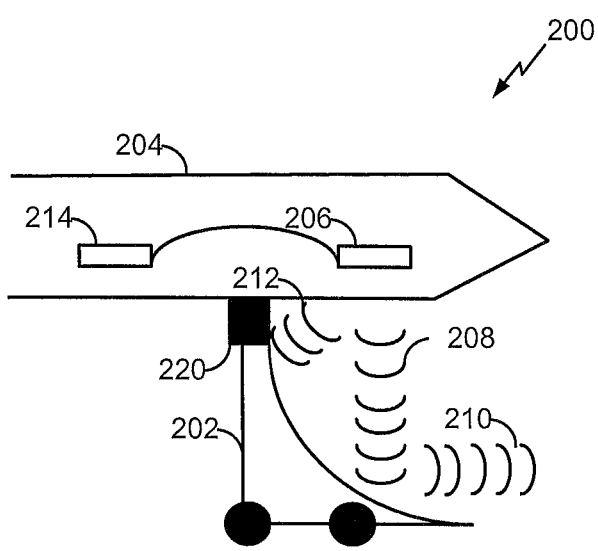
FIG. 2 is a diagram of a system including a product undergoing RF emissions interference testing.

Referring to FIG. 2, a particular embodiment of a system 200 including a product 204 undergoing RF emissions interference testing is shown. The product 204 includes a device under test 214 and an RF radiating device 206. The RF emissions interference test may be performed to determine whether use of the RF radiating device 206 interferes with operation of the device under test 214 during normal operation of the product 204.

In the system 200, an RF reflecting apparatus 202 is used to facilitate simulation of normal operation of the product 204. The RF reflecting apparatus 202 reflects (and to some extent absorbs) RF signals emitted by the RF radiating device 206 to prevent ground reflections of the RF signals from interfering with the device under test 214. The RF reflecting apparatus 202 corresponds to the RF reflecting apparatus 100 described with respect to FIGS. 1A-1E.

The RF reflecting apparatus 202 may be mobile and may be moved into a desired position prior to testing the device under test 214. For example, the RF reflecting apparatus 202 may be moved (e.g., translated, rotated, or both) into position under a nose or another portion of the product 204. Thus, the RF reflecting apparatus 202 may be sized for portable testing (e.g., capable of being moved into a position under human power). For example, the RF reflecting apparatus 202 may be smaller than the product 204 in at least one dimension. This is in contrast, for example, to RF emissions interference testing in an anechoic chamber, where the chamber is generally larger than and surrounds the product under test. Sizing the RF reflecting apparatus 202 smaller than the product 204 enables testing of components of the product 204 (such as the device under test 214) on the ground without causing interference due to the ground reflecting RF energy and without use an anechoic chamber.

During the RF emissions interference test, a first signal portion 208 of the RF signals emitted by the RF radiating device 206 may be reflected away from the product 204 as reflected RF signal 210. A second portion 212 of the RF signals emitted by the RF radiating device 206 may be absorbed by RF absorbing portions 220 of the RF reflecting apparatus 202. The RF absorbing portions 220 may include or correspond to the resistive material 104, the RF absorbing foam 106, or both, of FIGS. 1A-1E. In a particular embodiment, the RF absorbing portions 220 includes an RF absorbing foam that, in addition to absorbing RF signals, is configured to physically isolate the RF reflecting apparatus 202 from the product 204 in order to protect the product 204 from damage due to accidental contact while the RF reflecting apparatus 202 is being moved into position below the product.

Figure 3:
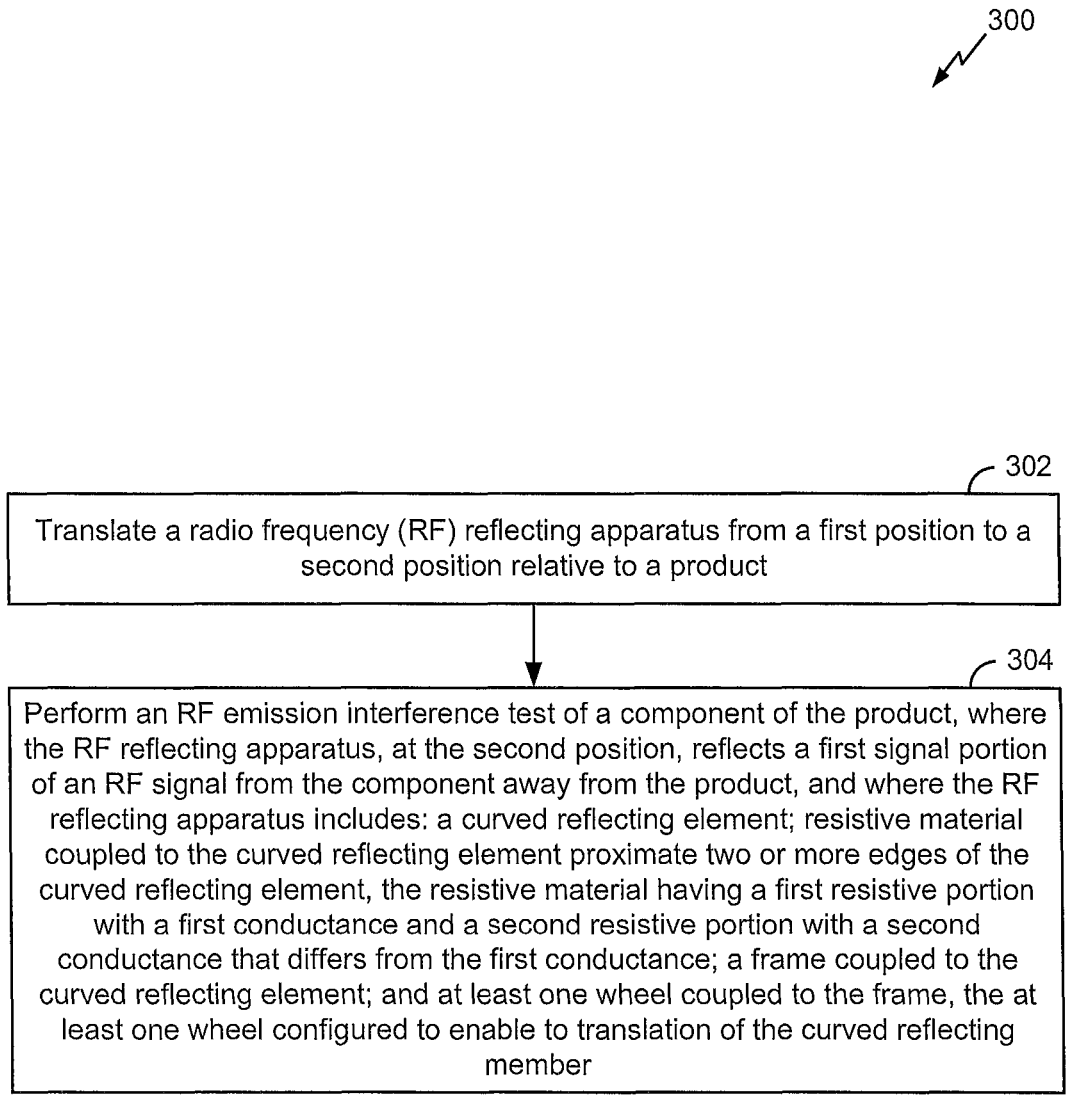
FIG. 3 is a flow chart that illustrates an embodiment of a method of testing components of a product.

Referring to FIG. 3, a particular illustrative embodiment of a method 300 of testing components of a product is shown. For example, the product may be an aircraft, a spacecraft, or another platform that includes an RF radiating component. The product may be tested to determine whether operation of the RF radiating component causes electrical interference with another component of the product. To simulated normal operation of the product (e.g., operation of the product away from the ground), an RF reflecting apparatus, such as the RF reflecting apparatus 100 of FIGS. 1A-1E or the RF reflecting apparatus 202 of FIG. 2, may be used. For example, the RF reflecting apparatus may include a curved reflecting element and resistive material coupled to the curved reflecting element proximate two or more edges of the curved reflecting element. The resistive material may have a first resistive portion with a first conductance and a second resistive portion with a second conductance that differs from the first conductance. The RF reflecting apparatus may also include a frame coupled to the curved reflecting element and at least one wheel coupled to the frame. The at least one wheel may be configured to enable translation of the curved reflecting member such that the curved reflecting member can be positioned appropriately relative to the product.

The method 300 includes, at 302, moving the RF reflecting apparatus from a first position to a second position under the product. The RF reflecting apparatus may be translated (e.g., rolled along the ground using the wheel assembly 118 of FIGS. 1A-1E), rotated (e.g., turned to have a particular orientation relative to the product), or translated and rotated. To illustrate, as shown in FIG. 2, the RF reflecting apparatus 202 may be moved under the product 204 and rotated such that the reflected RF signals 210 are reflected in a safe direction away from the product 204.

The method 300 further includes, at 304, performing an RF emission interference test of a component (e.g., a device under test) of the product. During the RF emission interference test, the RF reflecting apparatus reflects a first signal portion of an RF signal from the RF radiating component away from the product. In an exemplary embodiment, the RF radiating component is a radar array, the product is an aircraft, a spacecraft, a missile, or another platform, and the device under test is a component of the product that may be subject to RF interference due to RF signals from the RF radiating component. Thus, the method 300 enables simplified, relatively low-cost, RF emissions interference testing to be performed without the use of an anechoic chamber.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the illustrations or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments and other embodiments not specifically described herein will be apparent to those of skill in the art upon reviewing the description.

In the foregoing Detailed Description, various features may have been grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A radio frequency (RF) reflecting apparatus comprising:
   a curved reflecting element;
   resistive material coupled to the curved reflecting element proximate two or more edges of the curved reflecting element, the resistive material having a first portion with a first conductance and a second portion with a second conductance that differs from the first conductance;

a frame coupled to the curved reflecting element; and at least one wheel coupled to the frame, the at least one wheel configured to enable translation of the curved reflecting member.

2. The RF reflecting apparatus of claim 1, wherein the at least one wheel is further configured to enable rotation of the curved reflecting element.

3. The RF reflecting apparatus of claim 1, further comprising RF absorbing foam coupled to the resistive material.

4. The RF reflecting apparatus of claim 1, wherein the curved reflecting element is elongated along a first axis and curved about the first axis such that the curved reflecting element has a substantially uniform cross-section at each location that is perpendicular to the first axis.

5. The RF reflecting apparatus of claim 1, wherein the resistive material comprises a resistive card.

6. The RF reflecting apparatus of claim 1, wherein the frame includes a fiber glass element, wherein the curved reflecting element is coupled to the fiber glass element, and wherein the resistive material is resistive taper tape coupled to the fiber glass element proximate each edge of the curved reflecting element.

7. The RF reflecting apparatus of claim 1, wherein the first conductance is greater than the second conductance.

8. The RF reflecting apparatus of claim 7, wherein the first conductance substantially matches a conductance of the curved reflecting element.

9. The RF reflecting apparatus of claim 7, wherein the second conductance substantially matches a conductance of air.

10. The RF reflecting apparatus of claim 7, wherein the first portion is located at a first edge of the resistive material and the second portion is located at a second edge of the resistive material, wherein a first distance between the first edge and the curved reflecting element is less than a second distance between the second edge and the curved reflecting element.

11. The RF reflecting apparatus of claim 10, wherein the resistive material between the first edge and the second edge gradually transitions from the first conductance to the second conductance.

12. A method comprising:

translating a radio frequency (RF) reflecting apparatus from a first position to a second position relative to a product; and performing an RF emission interference test of a component of the product, wherein the RF reflecting apparatus, at the second position, reflects a first signal portion of an RF signal away from the product, and wherein the RF reflecting apparatus comprises:

a curved reflecting element;

resistive material coupled to the curved reflecting element proximate two or more edges of the curved reflecting element, the resistive material having a first resistive portion with a first conductance and a second resistive portion with a second conductance that differs from the first conductance;

a frame coupled to the curved reflecting element; and at least one wheel coupled to the frame, the at least one wheel configured to enable translation of the curved reflecting member.

13. The method of claim 12, further comprising rotating the RF reflecting apparatus.

14. The method of claim 12, wherein the first resistive portion reflects a second signal portion of the RF signal.

15. The method of claim 14, wherein the second resistive portion absorbs a third signal portion of the RF signal.

16. The method of claim 15, wherein the RF reflecting apparatus further comprises an RF absorbing foam coupled to the resistive material, and wherein the RF absorbing foam absorbs a fourth signal portion of the RF signal.

17. The method of claim 16, wherein the RF absorbing foam protects the product during translation of the RF reflecting apparatus to the second position.

18. The method of claim 12, wherein the curved reflecting element is elongated along a first axis and curved about the first axis such that the curved reflecting element has a substantially uniform cross-section at each location that is perpendicular to the first axis.

19. The method of claim 12, wherein the first resistive portion is located at a first edge of the resistive material and the second resistive portion located at a second edge of the resistive material, wherein a first distance between the first edge and the curved reflecting element is less than a second distance between the second edge and the curved reflecting element, and wherein the resistive material between the first edge and the second edge gradually transitions from the first conductance to the second conductance.

20. The method of claim 19, wherein the first conductance is greater than the second conductance.

* * * * *

UNITED STATES PATENT AND TRADEMARK OFFICE
CERTIFICATE OF CORRECTION

| | |
|---|---|
| PATENT NO. | : 9,523,726 B2 |
| APPLICATION NO. | : 14/335748 |
| DATED | : December 20, 2016 |
| INVENTOR(S) | : Paul R. Heumphreus et al. |

It is certified that error appears in the above-identified patent and that said Letters Patent is hereby corrected as shown below:

In the Government Interest Section, "This invention was made with Government support." should read --This invention was made with Government support under F33657-03-C-2001 awarded by the Air Force.--

Signed and Sealed this
Thirty-first Day of January, 2017

Michelle K. Lee
*Director of the United States Patent and Trademark Office*